United States Patent
King et al.

(10) Patent No.: US 8,133,531 B2
(45) Date of Patent: Mar. 13, 2012

(54) TITANIUM DIOXIDE PARTICLES COATED VIA AN ATOMIC LAYER DEPOSITION PROCESS

(75) Inventors: David M. King, Boulder, CO (US); Alan W. Weimer, Niwot, CO (US)

(73) Assignee: The Regents of the University of Colorado, Boulder, CO (US)

(*) Notice: Subject to any disclaimer, the term of this patent is extended or adjusted under 35 U.S.C. 154(b) by 0 days.

(21) Appl. No.: 12/399,145

(22) Filed: Mar. 6, 2009

(65) Prior Publication Data

US 2010/0326322 A1 Dec. 30, 2010

Related U.S. Application Data

(60) Provisional application No. 61/034,504, filed on Mar. 7, 2008.

(51) Int. Cl.
*B05D 7/00* (2006.01)
*C23C 16/00* (2006.01)

(52) U.S. Cl. .................. 427/214; 427/248.1; 427/212; 427/213; 427/215

(58) Field of Classification Search .................. None
See application file for complete search history.

(56) References Cited

U.S. PATENT DOCUMENTS

| | | | | |
|---|---|---|---|---|
| 4,014,709 A | * | 3/1977 | Dykstra et al. | 106/439 |
| 4,916,170 A | * | 4/1990 | Nambu et al. | 523/137 |
| 6,613,383 B1 | * | 9/2003 | George et al. | 427/212 |
| 6,713,177 B2 | * | 3/2004 | George et al. | 428/402 |
| 2001/0041217 A1 | * | 11/2001 | Sanjurjo et al. | 427/213 |
| 2004/0224087 A1 | * | 11/2004 | Weimer et al. | 427/212 |
| 2007/0280895 A1 | * | 12/2007 | Weimer et al. | 424/59 |

* cited by examiner

*Primary Examiner* — Timothy Meeks
*Assistant Examiner* — Joseph Miller, Jr.
(74) *Attorney, Agent, or Firm* — Gary C Cohn PLLC

(57) ABSTRACT

Titanium dioxide particles are coated first with an interstitial coating and then with silicon dioxide or alumina. The coatings are suitably applied via an atomic layer deposition process. The interstitial coating preserves the bright white coloration of the particles after they are coated. The particles therefore can be used as pigments and white fillers in polymers, paints, paper and other applications.

2 Claims, No Drawings

TITANIUM DIOXIDE PARTICLES COATED VIA AN ATOMIC LAYER DEPOSITION PROCESS

CROSS-REFERENCE TO RELATED APPLICATION

This application claims benefit of U.S. Provisional Patent Application No. 61/034,504, filed 7 Mar. 2008.

STATEMENT OF GOVERNMENT INTEREST

This invention was made with government support under grant number DMI0420046 awarded by the National Science Foundation. The government has certain rights in the invention.

BACKGROUND OF THE INVENTION

This invention relates to titanium dioxide particles having a passivating coating.

Titanium dioxide is widely used as a filler and pigment in paints and other coatings, in many polymer systems, in paper, and in other applications. Titanium dioxide has a characteristic bright, white color, which makes it a pigment of choice in many applications.

One problem with using titanium dioxide is that it catalyzes a large number of reactions, particularly among organic materials, and it also can participate in numerous other reactions. In some coating and polymer systems, titanium dioxide can catalyze unwanted depolymerization reactions or catalyze unwanted reactions between components of the system. This can lead to problems such as a deterioration of physical properties, or a loss of other desirable attributes.

It has been proposed to coat titanium dioxide with a passivating coating, which would, in effect, encapsulate the titanium dioxide and prevent other materials from coming into contact with titanium dioxide species. Alumina and/or silica coatings have been proposed, because they are optically transparent in the visible light spectrum and are not highly reactive or catalytic species.

There remains the problem of applying such a coating to titanium dioxide particles. Titanium dioxide filler particles and pigments are finely divided, usually having an average particle diameter in the range of 1 micron or less. The titanium dioxide particles can be as small as 10 nanometers. It is very difficult to coat such small particles uniformly, and without "gluing" the particles together to form large agglomerates. It is also desirable to provide a coating that is as thin as possible, to reduce raw material costs and preserve the characteristic bright white appearance of the underlying titanium dioxide.

U.S. Published Patent Application No. 2004/0224087 describes coating $TiO_2$ base particles with one or more $SiO_2$ coating layers, using an atomic layer deposition process. In U.S. Pat. No. 6,713,177, it is proposed to use an atomic layer deposition process to coat titanium dioxide particles with a coating, such as a nitride, to reduce the photocatalyic properties of the titanium dioxide. The coating particles are described as being useful in certain coating applications. The atomic layer deposition process is described in these references as being capable of forming ultrathin, conformal coatings on substrate particles, without agglomerating the particles.

It has been discovered that when a silica or alumina coating is applied to titanium dioxide particles via an atomic layer deposition (ALD) process, the coated particles become colored. The coated particles exhibit a blue or green color, which is surprising considering that titanium dioxide, silica and alumina are all colorless materials. This coloration makes the coated particles useless in most applications in which a colorless filler is needed, or in which the bright white color of titania is needed.

SUMMARY OF THE INVENTION

In one aspect, this invention is a material in the form of particles having an average diameter of up to about 1 micron, the particles comprising a titanium dioxide base particle, an interstitial coating on the surface of the titanium dioxide base particle, and at least one silica or alumina coating on the surface of the interstitial coating.

In another aspect, this invention is a material in the form of particles having an average diameter of up to about 1 micron, the particles comprising a titanium dioxide base particle, a metal or semi-metal nitride coating on the surface of the titanium dioxide base particle, and at least one silica or alumina coating on the surface of the metal nitride coating.

The coatings are preferably applied via an atomic layer deposition process, as described more fully below.

The invention is also a method for producing coated titanium dioxide particles having a bright white appearance, comprising a. applying an interstitial coating of about 0.4 angstroms to 50 nanometers in thickness to the surface of titanium dioxide base particles by an atomic layer deposition process and b. applying a layer of silica or alumina of about 0.4 angstroms to 50 nanometers in thickness on the surface of the interstitial coating by an atomic layer deposition process.

DETAILED DESCRIPTION OF THE INVENTION

The titanium dioxide base particle has an average diameter of up to one micron, preferably up to about 350 nanometers, more preferably up to about 200 nanometers. The titanium dioxide particles may have an average diameter as small as about 10 nanometers.

The titanium dioxide base particles may be crystalline or amorphous. Preferred pigment grade titanium dioxide particles are at least partially crystalline, the crystallites being of either the anatase or rutile phase, or a mixture of both.

Suitable nano-sized $TiO_2$ particles are commercially available from Du Pont Titanium Technologies, Nanophase Technologies, Inc. (Romeroville, Ill.) and Degussa AG. An example of a suitable nano-sized $TiO_2$ particle is Degussa Aeroxide™ P25.

The interstitial coating is a coating of one or more materials, other than titanium dioxide, silica or alumina. A preferred interstitial coating is made up of one or more layers of a metal or semi-metal nitride, such as boron nitride, silicon nitride or titanium nitride. The interstitial coating may be as thin as can be deposited with a single atomic layer deposition cycle as described below. This can be as low as about 0.4 angstroms in some cases. The interstitial coating may be as thick as 50 nanometers, but a thickness of greater than about 10 nanometers provides little additional benefit. A preferred thickness is from 1 angstrom to about 5 nanometers, especially from 1.5 angstroms to 1 nanometer. Surprisingly, such extremely thin interstitial coatings are usually adequate to prevent discoloration from forming when a silica or alumina coating is subsequently applied.

The interstitial layer is in turn coated with one or more silica or alumina layers. The silica or alumina coating may be as thin as about 0.4 angstroms, but is preferably at least 1 nanometer thick. It may be as thick as 50 nanometers or even more, but a coating thicker than about 20 nanometers provides little additional benefit. A preferred thickness for the silica or alumina coating is from 1.5 to 10 nanometers.

The interstitial coating and the silica or alumina coating are each preferably conformal. By "conformal", it is meant that the thickness of the coating layer is relatively uniform across the surface of the particle (so that, for example, the thickest regions of the coating are no greater than 3× the thickness of the thinnest regions), so that the surface shape of the coated substrate closely resembles that of the underlying substrate surface. Conformality is determined by methods such as transmission electron spectroscopy (TEM) that have resolution of 10 nm or below. Lower resolution techniques cannot distinguish conformal from non-conformal coatings at this scale. The surface is preferably coated by the alumina or silica layer substantially without pinholes or defects. The interstitial layer may be too thin to ensure a uniform coating.

Preferred coated particles of the invention include a titanium oxide base particle, which is coated with a boron nitride, silicon nitride or titanium nitride interstitial coating, which is in turn coated with a silica or alumina coating. In especially preferred embodiments, the boron nitride, silicon nitride or titanium nitride interstitial coating is from 0.4 angstroms to 5 nanometers, especially from 1.5 angstroms to 1 nanometer, thick and the silica or alumina coating is from 1.5 to 10 nanometers thick.

The particle may contain additional coatings, but these are usually unnecessary and provide little benefit and are preferably omitted.

The coated particles of the invention are preferably non-agglomerated after the coating is deposited. By "non-agglomerated", it means that the particles do not form significant amounts of agglomerates during the process of coating the substrate particles. Particles are considered to be non-agglomerated if (a) the average particle diameter does not increase more than about 5%, preferably not more than about 2%, more preferably not more than about 1% (apart from particle size increases attributable to the coating itself) as a result of depositing the coatings, or (b) if no more than 2 weight %, preferably no more than 1 weight % of the particles become agglomerated during the process of depositing the coatings.

The coating layers are advantageously deposited in an atomic layer deposition (ALD) process, using the titanium dioxide base particles as a substrate. A suitable ALD process for depositing nanocoatings on fine particles is described in U.S. Pat. Nos. 6,613,383, 6,713,177, U.S. Published Patent Application No. 2004/0224087 and WO 03/008186A1. In the ALD process, the coating-forming reaction is conducted as a series of (typically) two half-reactions. In each of these half-reactions, a single reagent is introduced into contact with the substrate particle surface. Conditions are such that the reagent is in the form of a gas. The reagent reacts with functional groups on the surface of the particle and becomes bound to the particle. Excess amounts of the reagent are removed, which helps to prevent the growth of undesired, larger inclusions of the coating material. Each remaining half-reaction is then conducted in turn, each time introducing a single reagent, allowing it to react at the surface of the particle, and removing excess reactant before introducing the next reagent. Usually, a carrier gas is used to introduce the reagents, and the reaction chamber usually is swept with the carrier gas between successive reagent introductions to help remove excess reagents and gaseous reaction products.

Atomic layer controlled growth techniques permit the deposition of coatings of about 0.1 to 5 angstroms in thickness per reaction cycle, and thus provide a means of extremely fine control over coating thickness. Thicker coatings can be prepared by repeating the reaction sequence to sequentially deposit additional layers of the coating material until a desired coating thickness is achieved.

A convenient method for applying the coating to the base particles is to form a fluidized bed of the particles, and then pass the various reagents in turn through the fluidized bed under reaction conditions. Methods of fluidizing particulate materials are well known, and generally include supporting the particles on a porous plate or screen. A fluidizing gas is passed upwardly through the plate or screen, lifting the particles somewhat and expanding the volume of the bed. With appropriate expansion, the particles behave much as a fluid. Fluid (gaseous or liquid) reagents can be introduced into the bed for reaction with the surface of the particles. In this invention, the fluidizing gas also can act as an inert purge gas for removing unreacted reagents and volatile or gaseous reaction products.

In addition, the reactions can be conducted in a rotating cylindrical vessel or a rotating tube. This method is particularly suitable for continuous processes.

An illustrative reaction sequence for producing a nitride interstitial coating is shown in equations A1 and B1. The reactions shown below are not balanced, and are only intended to show the reactions at the surface of the particles (i.e., not inter- or intralayer reactions).

$$\text{Ti—O—H*} + M^1_m X_n \rightarrow \text{Ti—O-}M^1\text{-}X^* + HX \quad (A1)$$

$$\text{Ti—O-}M^1\text{-}X^* + NH_3 \rightarrow \text{Ti—O-}M^1\text{-N—H*} + HX \quad (B1)$$

wherein the asterisks (*) indicate surface species, $M^1$ represents a metal or semi-metal atom that forms a nitride, X represents a displaceable nucleophilic group, and m and n are such that $M^1_m X_n$ is an electrostatically neutral compound. The $M^1$ and X groups are selected together so that the $M^1_m X_n$ compound is a gas at the reaction temperature, or otherwise has a vapor pressure of at least 0.1 Torr at the reaction temperature.

Ammonia can be eliminated to form $M^1$-N-$M^1$ bonds within or between layers. This reaction can be promoted if desired by, for example, annealing at elevated temperatures and/or reduced pressures.

Each $M^1$ is preferably silicon, boron or titanium. Suitable X groups include halogens such as chlorine, tertiary alkyl, alkylamido, dialkylamino groups such as dimethylamino groups, and the like. Preferred $M^1_m X_n$ compounds include tris-dimethyaminosilane, silicon tetrachloride, tetraethylorthosilicate, t-butyoxysilanol, boron trichloride, titanium tetrachloride, tetrakis-ethylamido titanium and the like.

Methods for producing titanium nitride and silicon nitride films by atomic layer deposition are described, for example, by Kim et al., *Thin Solid Films* 2000, 372, 276, Elam et al., *Thin Solid Films* 2003, 436, 145 and Klaus et al. *Surface Science* 1998, 418, L14. Elam et al. report that the ALD-applied titanium nitride films are highly porous at the temperature at which they were deposited.

Reactions (A1) and (B1) are repeated, in turn, for a number of reaction cycles sufficient to provide a coating of the desired thickness. As few as one reaction cycle may be sufficient in some cases, but four to five reaction cycles are a preferred minimum and more reaction cycles can be conducted to provide a thicker coating.

Reaction conditions are selected mainly to meet two criteria. The first criterion is that the reagents are gaseous under the conditions of the reaction. Therefore, temperature and pressure conditions are selected such that the reactants are volatilized. The reactions are generally performed at elevated temperatures, preferably from about 400-1000K, although in some instances reaction temperatures as low at approximately 290K can be used. Preferred temperatures are from about 400-700K. The second criterion is one of reactivity. Conditions, particularly temperature, are selected such that the desired reaction between the film-forming reagents (or, at the start of the reaction, the first-introduced reagent and the particle surface) occurs at a commercially reasonable rate.

Between reactions, the particles are subjected to conditions sufficient to remove reaction products and unreacted reagents. This can be done, for example, by subjecting the particles to a high vacuum, such as about $10^{-5}$ Torr or greater, after each reaction step. Another method of accomplishing this, which is more readily applicable for industrial application, is to sweep the particles with an inert purge gas between the reaction steps. This purge gas can also act as a fluidizing medium for the particles and as a carrier for the reagents.

Several techniques are useful for monitoring the progress of the reaction. For example, vibrational spectroscopic studies can be performed on high surface area silica powders using transmission Fourier transform infrared techniques. The deposited coatings can be examined using in situ spectroscopic ellipsometry. Atomic force microscopy studies can be used to characterize the roughness of the coating relative to that of the surface of the substrate. X-ray photoelectron spectroscopy and x-ray diffraction can by used to do depth-profiling and ascertain the crystallographic structure of the coating.

In some instances, a gray or off-white color is produced when a nitride film is applied. This is seen most often when the X group of the $M^1{}_mX_n$ material is a nitrogen-containing species that produces an amine reaction by-product. It is believed that the coloration is caused by the amine reaction product becoming sorbed onto or into the particle. The preferential readsorption of dimethylamine has been observed before during titanium nitride atomic layer depositions that used tetrakis-dimethylamido titanium and ammonia as precursor materials. See, e.g., Okada et al., *Applied Surface Science* 1999, 137, 113. The coloration can be removed by heat treating the coated particles to a temperature of 600° C. or higher for a brief period. This restores the characteristic bright white color of titanium dioxide and also removes residual amine odor that is sometimes present. The heat treatment can be done before or after the silica or alumina layer is applied.

A silica or alumina coating is deposited on top of the interstitial coating. Silica coatings can be deposited via atomic layer deposition methods using the following reaction sequence A2/B2. As before, the illustrated reactions are not balanced, and are only intended to show the reactions at the surface of the particles (i.e., not inter- or intralayer reactions).

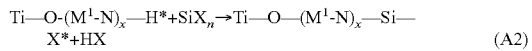

(A2)

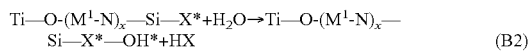

(B2)

In reaction A2/B2, $M^1$, n and X are as defined above, and x represents the degree of polymerization of the interstitial coating. In reaction A2, reagent $SiX_n$ reacts with one or more surface N—H groups on the surface of the particle to create a new surface group having the form —Si—X. The silicon atom is bonded to the particle through one or more nitrogen atoms. The —Si—X group represents a site that can react with water in reaction B2 to regenerate one or more hydroxyl groups. The surface hydroxyl groups formed in reaction B2 can serve as functional groups through which reactions A2 and B2 can be repeated, each time adding a new layer of silicon atoms. Note that hydroxyl groups can be eliminated as water, forming Si—O—Si bonds within or between layers. This condensation reaction can be promoted if desired by, for example, annealing at elevated temperatures and/or reduced pressures.

The SiXn reagent may be, for example, silicon tetrachloride, tris-dimethylaminosilane, tetraethylorthosilicate, t-butyoxysilanol or the like.

A catalyzed ALD reaction for depositing a silica coating can be represented by reaction sequence A3/B3/C3, as follows. Once again, the illustrated reactions are not balanced, and are only intended to show the reactions at the surface of the particles (i.e., not inter- or intralayer reactions).

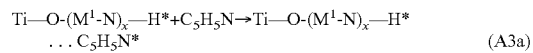

(A3a)

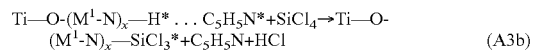

(A3b)

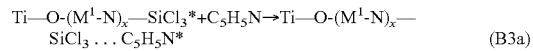

(B3a)

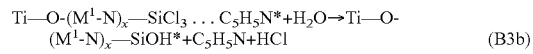

(B3b)

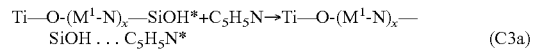

(C3a)

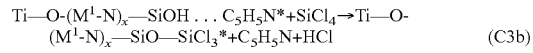

(C3b)

where the asterisks (*) again denote atoms at the surface of the particle. $C_5H_5N$ is the catalyst for each half-reaction in this sequence.

Alumina is conveniently deposited using trimethylaluminum and water as the precursors, as illustrated by reaction sequence A4/B4. As before, the illustrated reactions are not balanced, and are only intended to show the reactions at the surface of the particles (i.e., not inter- or intralayer reactions).

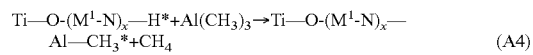

(A4)

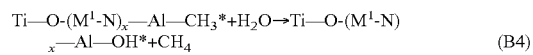

(B4)

In reactions A4/B4, $M^1$ is as defined above, and x represents the degree of polymerization of the interstitial coating. Reactions A4 and B4 are repeated until the desired coating thickness is obtained. Analogous reactions can be conducted using other precursor materials.

Coated titanium dioxide particles made in accordance with the invention can be used in the same manner and in the same applications as the uncoated base particles. The coated particles have diminished reactivity and catalytic activity, compared to the base particles, and so can be used in applications in which the reactivity or catalytic nature of uncoated titanium dioxide particles is problematic. Examples of applications include pigments for paints and other coatings, as a filler for polymers and/or paper, and the like.

The following examples are provided to illustrate coating processes applicable to making the particles of the invention. These examples are not intended to limit the scope of the inventions. All parts and percentages are by weight unless otherwise indicated.

Examples 1 and 2, and Comparative Sample A

A low-pressure fluidized bed reactor is used to deposit coatings onto anatase pigment grade titanium dioxide base particles. The base particles are commercially available from Millennium Chemicals. The titanium dioxide particles are nearly spherical and have primary diameters of about 160 nm. Their surface area is about 9.5 $m^2/g$.

The reactor apparatus includes, in sequence, a dose zone, a reactor zone and a pump zone. A pneumatically actuated diaphragm valve separates the dose and reactor zones. A manual gate valve separates the reactor and pump zones. A continuous rough vacuum is maintained in the pump zone. A bypass line connects the dose zone to the pump zone, divided by a normally closed pneumatic diaphragm valve. Both pneumatic valves are controlled by a single solid-state relay. The dose zone includes two precursor lines and a carrier gas line. Each precursor line is connected to a canister that holds the respective reagent.

The reactor zone includes a stainless steel fluidized bed reactor mounted within a clamshell-type furnace. The bed includes a distributor plate which supports the contents of the reactor. The reactor zone includes a stirring unit which helps to promote fluidization and separate the particles. The reactor zone also includes a pressure monitor.

30 grams of the base particles are charged to the reactor. Nitrogen or argon is flowed through the reactor at a rate of about 27 sccm to fluidize the particles. The reactor is heated to 500° C. and maintained at that temperature throughout the reaction cycles.

Comparative Sample A is made by depositing a 2.0-nm thick silicon oxide coating onto the base particles, by dosing the particles alternatingly with tris-dimethylaminosilane (TDMAS) and hydrogen peroxide. Fifty reaction cycles are performed, each cycle according to the following protocol:

1. TDMAS dose, 60 seconds.
2. Purge with inert gas (nitrogen or argon), 360 seconds
3. Hydrogen peroxide dose, 240 seconds
4. Purge with inert gas (nitrogen or argon), 600 seconds The resulting coated particles are light blue in color, rather than the characteristic bright white of the underlying titanium dioxide particles. The particles are heated briefly to 600° C. in an attempt to remove the blue color. This heat treatment reduces the coloration somewhat, but the treated particles retain a distinct blue coloration.

Example 1 is prepared in the same manner except that, before applying the silicon dioxide film, a very thin coating of silicon nitride is applied onto the base particles. The silicon nitride layer is applied in the same manner as described with respect to the silicon dioxide layer, except that ammonia is substituted for hydrogen peroxide in step 3 of the reaction cycle. 5 reaction cycles are conducted to form a silicon nitride film that is about 2 angstroms thick.

The resulting particles are slightly off-white and have an amine odor. This is attributed to the presence of a reaction by-product, dimethylamine, which is sorbed onto the particle surface. The particles are heated briefly to 600-700° C. This restores the color of the particles to a bright white and eliminates the amine odor.

Example 2 is prepared in the same manner as Example 1 except this time the particles are heated to 600-700° C. after the silicon nitride layer is applied, but before applying the silicon dioxide layer. The resulting particles are bright white.

Examples 3 and 4, and Comparative Sample B

Comparative Sample B is prepared in the manner similar to that described for Comparative Sample A. The base particle in this case is a rutile pigment grade titanium dioxide particulate. The particles have diameters from 280 nm and a surface area of 5.9 $m^2/g$. Dosing times are somewhat shorter, due to the lower surface area of the substrate. The coated particles have a light blue color that is reduced but not eliminated by heating them to 600° C.

Example 3 is prepared in the same manner as Comparative Sample B except that, before applying the silicon dioxide film, a very thin coating of silicon nitride is applied onto the base particles. The silicon nitride layer is applied in the same manner as described with respect to Example 1. This produces slightly off-white particles having an amine odor. When the particles are heated briefly to 600-700° C., their color is restored to a bright white, and the amine odor is eliminated.

Example 4 is prepared in the same manner as Example 3 except this time the particles are heated to 600-700° C. after the silicon nitride layer is applied, but before applying the silicon dioxide layer. The resulting particles are bright white.

Example 5

Example 5 is made in the same manner as Example 1, except that $SiCl_4$ replaces the TDMAS in both the silicon nitride- and silicon dioxide-forming reactions. Bright white particles are obtained.

Examples 6-9

Example 6 is made by applying a titanium nitride coating onto anatase pigment grade titanium dioxide particles, and then applying a silicon dioxide film to the coated particles. The process is the same as that described with respect to making Example 1, except that, the reagents used to apply the titanium nitride coating are tetrakis-ethylmethylamide-titanium (TEMAT) and ammonia. Five reaction cycles are applied to form the titanium nitride coating, and fifty reaction cycles are applied to form the silicon dioxide coating. As before, the particles are off-white and have an amine odor, which is attributed to absorbed ethylmethylamine. A bright white color is restored by heating the particles briefly to 600-700° C.

Example 7 is made in substantially the same manner as is Example 6, except that the base particles are rutile pigment grade titanium dioxide particles. Similar results are obtained.

Example 8 is also made in the same way, this time using 15-nm titanium dioxide nano particles as the base particle. The base particles are mainly in the anatase phase. Dosing times are increased to compensate for the increased surface area of the base particles. Again, similar results are obtained.

Example 9 is made in the same manner as Example 6 except this time titanium tetrachloride is substituted for the TEMAT in making the titanium nitride layer and silicon tetrachloride is substituted for the TMDAS in making the silicon dioxide layer. Bright white particles are obtained.

Examples 10-13

Examples 10-13 are made in the same reactor and under the same general conditions described with respect to the previous examples. In Example 10, the base particle is an anatase pigment grade titanium dioxide as described in previous examples. Titanium nitride, silicon nitride and silicon dioxide films are applied to the base particles in that order.

The titanium nitride film is applied by dosing the base particles alternatingly with TEMAT and ammonia. Five reaction cycles are performed, each cycle according to the following protocol:

1. TEMAT dose, 60 seconds.
2. Purge with inert gas (nitrogen or argon), 360 seconds 3. Ammonia dose, 240 seconds 4. Purge with inert gas (nitrogen or argon), 600 seconds The silicon nitride film is then applied, using three reaction cycles as just described, except the reagents are TDMAS and ammonia. Finally, the silicon dioxide film is applied in the same manner, using fifty reaction cycles. Reagents are TDMAS and hydrogen peroxide. As in most previous examples using TEMAT and TDMAS as reagents, the product particles are off-white, and can be restored to a bright white color by heating briefly to 600-700° C.

Example 11 is made in the same way as Example 10 except that $TiCl_4$ and $SiCl_4$ are substituted for TEMAT and TEMAS, respectively. Bright white particles are obtained.

Example 12 is made in the same way as Example 10 except that the silicon nitride layer is applied first, followed in turn by the titanium nitride layer and the silicon dioxide layer. Results are similar to Example 10.

Example 13 is made in the same way as Example 12 except that $TiCl_4$ and $SiCl_4$ are substituted for TEMAT and TEMAS, respectively. Bright white particles are obtained.

Example 14 and Comparative Sample C

Using the equipment and general protocol described in the previous examples, an alumina film is deposited onto rutile pigment grade titanium dioxide particles. The reagents in this case are trimethylaluminum and water. 10 reaction cycles are conducted. The resulting particles (Comparative Sample C) are blue.

Comparative Sample C is repeated, this time applying a silicon nitride coating on the base particles before depositing the alumina layer. The silicon nitride layer is applied in the same manner described in Example 6. The resulting particles are bright white.

What is claimed is:

1. A method for producing coated titanium dioxide particles having a bright white appearance, comprising
    a. applying an interstitial boron nitride, silicon nitride or titanium nitride coating of about 1.5 angstroms to 1 nanometer in thickness to the surface of a titanium dioxide base particles by an atomic layer deposition process and
    b. applying a layer of alumina of about 1.5 to 10 nanometers in thickness on the surface of the interstitial coating by an atomic layer deposition process.

2. The method of claim 1, further comprising, after step a and before or after step b, heating the particles to a temperature of at least 600° C.

* * * * *